United States Patent
Kaga et al.

(10) Patent No.: US 10,873,315 B2
(45) Date of Patent: Dec. 22, 2020

(54) PIEZOELECTRIC VIBRATING PIECE AND PIEZOELECTRIC DEVICE

(71) Applicant: NIHON DEMPA KOGYO CO., LTD., Tokyo (JP)

(72) Inventors: Shigetaka Kaga, Saitama (JP); Kazuhiro Hirota, Saitama (JP)

(73) Assignee: NIHON DEMPA KOGYO CO., LTD., Tokyo (JP)

(*) Notice: Subject to any disclaimer, the term of this patent is extended or adjusted under 35 U.S.C. 154(b) by 534 days.

(21) Appl. No.: 15/867,697

(22) Filed: Jan. 11, 2018

(65) Prior Publication Data
US 2018/0205364 A1     Jul. 19, 2018

(30) Foreign Application Priority Data

Jan. 17, 2017 (JP) .................. 2017-005493

(51) Int. Cl.
| H01L 41/047 | (2006.01) |
| H03H 9/13 | (2006.01) |
| H03H 9/19 | (2006.01) |
| H03H 9/10 | (2006.01) |
| H03H 9/02 | (2006.01) |
| H03H 9/17 | (2006.01) |

(52) U.S. Cl.
CPC ........ *H03H 9/132* (2013.01); *H03H 9/02062* (2013.01); *H03H 9/02157* (2013.01); *H03H 9/10* (2013.01); *H03H 9/1021* (2013.01); *H03H 9/177* (2013.01); *H03H 9/19* (2013.01)

(58) Field of Classification Search
CPC ............... H03H 9/132; H03H 9/02062; H03H 9/02157; H03H 9/10; H03H 9/1021; H03H 9/177; H03H 9/19

USPC .................................................. 310/363–366
See application file for complete search history.

(56) References Cited

U.S. PATENT DOCUMENTS

| 2018/0054181 A1* | 2/2018 | Kaga ..................... H03H 9/0514 |
| 2018/0115301 A1* | 4/2018 | Kaga ..................... H01L 41/053 |
| 2018/0167051 A1* | 6/2018 | Kaga ..................... H03H 9/1021 |

FOREIGN PATENT DOCUMENTS

| JP | H10308645 | 11/1998 |
| JP | 2002217675 | 8/2002 |
| JP | 2005318477 | 11/2005 |
| WO | 2015133472 | 9/2015 |

* cited by examiner

*Primary Examiner* — Thomas M Dougherty
(74) *Attorney, Agent, or Firm* — JCIPRNET

(57) ABSTRACT

A piezoelectric vibrating piece includes a piezoelectric substrate and excitation electrodes. The excitation electrode includes a main thickness portion and an inclined portion, the main thickness portion has a constant thickness, the inclined portion is formed on a peripheral area of the main thickness portion, the inclined portion gradually decrease in thickness from a part contacting the main thickness portion toward an outermost periphery of the excitation electrode. The inclined portion has a width as an inclination width in a length of 0.84 times or more and 1.37 times or less of a first flexural wavelength and 2.29 times or more and 3.71 times or less of a second flexural wavelength, the first flexural wavelength is a wavelength of a flexure vibration at a fundamental wave of the thickness-shear vibration, the second flexural wavelength is a wavelength of a flexure vibration at a third harmonic of the thickness-shear vibration.

10 Claims, 10 Drawing Sheets

PIEZOELECTRIC VIBRATING PIECE AND PIEZOELECTRIC DEVICE

CROSS-REFERENCE TO RELATED APPLICATIONS

This application is based on and claims priority under 35 U.S.C. § 119 to Japanese Patent Application No. 2017-005493, filed on Jan. 17, 2017, the entire content of which is incorporated herein by reference.

TECHNICAL FIELD

This disclosure relates to a piezoelectric vibrating piece that includes an inclined portion on a peripheral area of an excitation electrode, and a piezoelectric device.

DESCRIPTION OF THE RELATED ART

There has been known a piezoelectric device where one piezoelectric device simultaneously outputs two signals with different frequencies. For example, International Publication Pamphlet No. WO 2015/133472 discloses that one piezoelectric vibrating piece is configured to simultaneously output two signals with different frequencies. The piezoelectric vibrating piece that simultaneously oscillates two frequencies uses one frequency as an output signal and the other as a sensor for temperature compensation, for example. In such case, one piezoelectric vibrating piece obtaining two frequencies is preferable because of reduction of an influence of an individual difference and similar reason.

Such piezoelectric vibrating piece is configured by forming an excitation electrode on a piezoelectric substrate, for example. The piezoelectric substrate is formed in a convex shape having a thin periphery so as to confine vibration energy, thus reducing unnecessary vibration. However, there is a problem that it takes labor and cost of processing to form the piezoelectric substrate in the convex shape. In contrast, Japanese Unexamined Patent Application Publication No. 2002-217675 discloses that disposing inclined portions, which gradually reduce thicknesses of the excitation electrodes, on peripheral areas of the excitation electrodes formed on both principal surfaces of the piezoelectric substrate kept in a flat plate shape, so as to reduce the labor and the cost of processing the piezoelectric substrate.

However, even in forming the inclined surface shape as disclosed in Japanese Unexamined Patent Application Publication No. 2002-217675, it has been found that an effect to reduce the unnecessary vibration is significantly different depending on dimensions of the inclined surface shape. That is, there is a problem that only disposing the inclined surface shape on the peripheral area of the excitation electrode fails to sufficiently reduce the unnecessary vibration. Moreover, there is a problem that, as disclosed in International Publication Pamphlet No. 2015/133472, when one piezoelectric vibrating piece is used to simultaneously output two signals with different frequencies, the unnecessary vibrations based on the respective frequencies occur, and it is difficult to reduce the unnecessary vibration compared with the case of oscillating one frequency.

A need thus exists for a piezoelectric vibrating piece and a piezoelectric device which are not susceptible to the drawback mentioned above.

SUMMARY

The piezoelectric vibrating piece of a first aspect includes a piezoelectric substrate and excitation electrodes. The piezoelectric substrate is formed in a flat plate shape. The piezoelectric substrate vibrates in a thickness-shear vibration. The excitation electrodes formed on respective both principal surfaces of the piezoelectric substrate. The excitation electrodes each include a main thickness portion and an inclined portion, the main thickness portion is formed to have a constant thickness, the inclined portion is formed on a peripheral area of the main thickness portion, the inclined portion is formed to gradually decrease in thickness from, a part contacting the main thickness portion toward an outermost periphery of the excitation electrode. The inclined portion has a width as an inclination width formed in a length of 0.84 times or more and 1.37 times or less of a first flexural wavelength and 2.29 times or more and 3.71 times or less of a second flexural wavelength, the first flexural wavelength is a wavelength of a flexure vibration at a fundamental wave of the thickness-shear vibration, the second flexural wavelength is a wavelength of a flexure vibration at a third harmonic of the thickness-shear vibration.

The piezoelectric vibrating piece of a second aspect includes a piezoelectric substrate, a first excitation electrode, and a second excitation electrode. The piezoelectric substrate is formed in a flat plate shape. The piezoelectric substrate vibrates in a thickness-shear vibration. The first excitation electrode is formed on one principal surface of the piezoelectric substrate. The second excitation electrode is formed on another principal surface of the piezoelectric substrate. The first excitation electrode is formed to have an identical thickness as a whole. The second excitation electrode includes a main thickness portion and an inclined portion, the main thickness portion is formed to have a constant thickness, the inclined portion is formed on a peripheral area of the main thickness portion, the inclined portion is formed to gradually decrease in thickness from a part contacting the main thickness portion toward an outermost periphery of the second excitation electrode. The main thickness portion is formed to be thicker than the thickness of the first excitation electrode. The inclined portion has a width as an inclination width formed in a length of 0.84 times or more and 1.37 times or less of a first flexural wavelength and 2.29 times or more and 3.71 times or less of a second flexural wavelength, the first flexural wavelength is a wavelength of a flexure vibration at a fundamental wave of the thickness-shear vibration, the second flexural wavelength is a wavelength of a flexure vibration at a third harmonic of the thickness-shear vibration.

BRIEF DESCRIPTION OF THE DRAWINGS

The foregoing and additional features and characteristics of this disclosure will become more apparent from the following detailed description considered with reference to the accompanying drawings.

FIG. 9A is a partial sectional drawing of a piezoelectric vibrating piece 140a.

DETAILED DESCRIPTION

The embodiments of this disclosure will be described in detail with reference to the drawings. The embodiments in the following description do not limit the scope of the disclosure unless otherwise stated.

First Embodiment

<Configuration of Piezoelectric Device 100>

Figure 1:
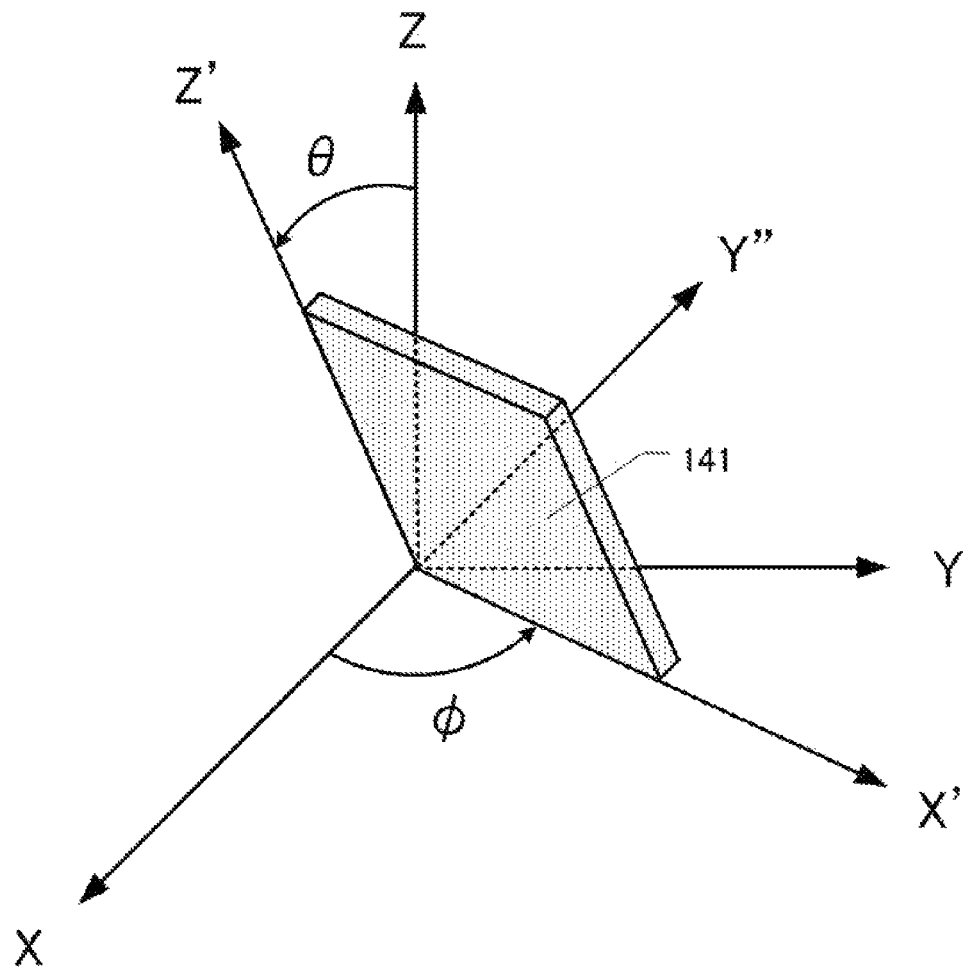
FIG. 1 is an explanatory drawing of an M-SC cut quartz-crystal material.
Figure 2A:
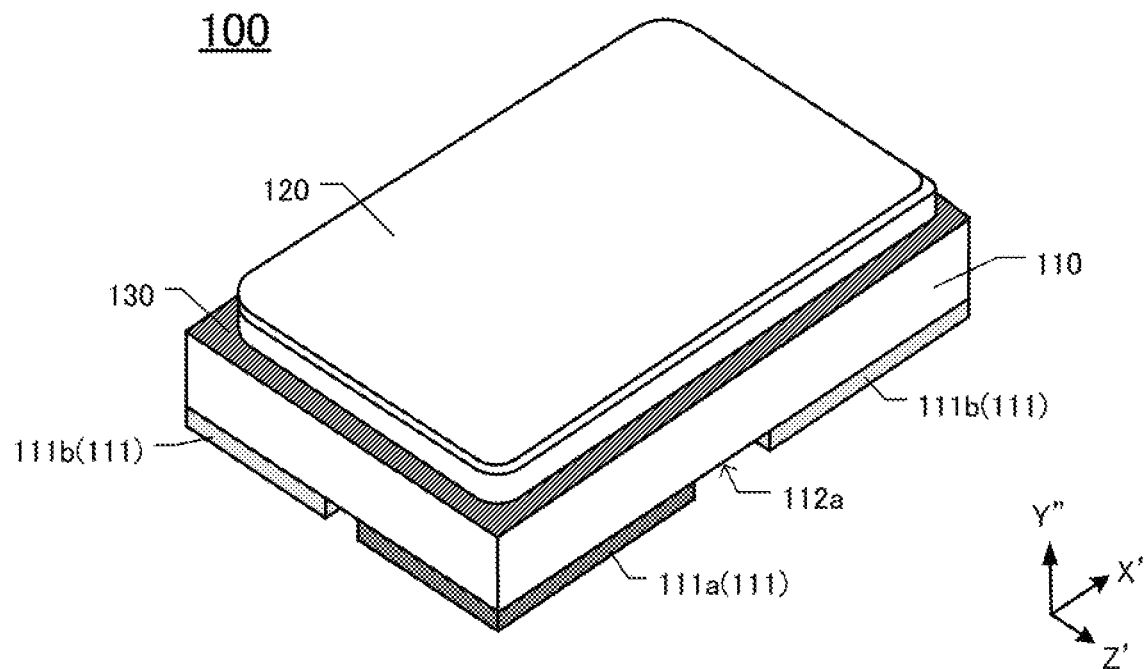
FIG. 2A is a perspective view of a piezoelectric vibrating piece 140.
Figure 2B:
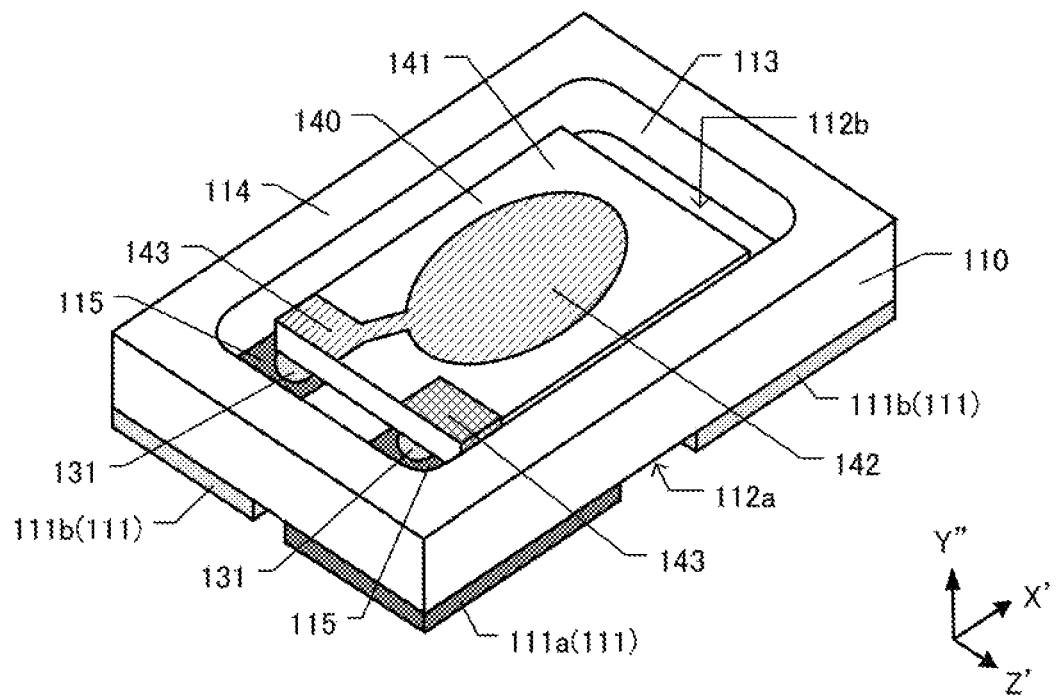
FIG. 2B is a perspective view of a piezoelectric device 100 where a lid 120 is removed.

FIG. 1 is an explanatory drawing of an M-SC cut quartz-crystal material. FIGS. 2A and 2B are explanatory drawings of a piezoelectric device 100. The piezoelectric device 100 illustrated in FIGS. 2A and 2B includes a piezoelectric vibrating piece 140, and the piezoelectric vibrating piece 140 is formed of a piezoelectric substrate 141, which is made of an M-SC (Modified-SC) cut quartz-crystal material, as a base material. The following describes the piezoelectric vibrating piece and the piezoelectric device that employ the M-SC cut quartz-crystal material based on crystallographic axes illustrated in FIG. 1.

In FIG. 1, the crystallographic axes of the crystal are indicated as an X-axis, a Y-axis, and a Z-axis. The M-SC cut quartz-crystal material is a kind of a doubly-rotated cut quartz-crystal material, and corresponds to an X'Z'-cut plate obtained by rotating an XZ-cut plate of the crystal around the Z-axis of the crystal by ϕ degree and further rotating an X'Z-cut plate generated by the rotation around an X'-axis by θ degree. In the case of the M-SC cut, ϕ is about 24 degrees and θ is about 34 degrees. In FIG. 1, new axes of a crystal element generated by the above doubly rotation are indicated by the X'-axis, a Y"-axis, and a Z'-axis. The doubly-rotated cut quartz-crystal material is used with what is called a C mode and a B mode, having shear displacement transmitted in a thickness direction, as main vibration.

FIG. 2A is a perspective view of the piezoelectric device 100. The piezoelectric device 100 mainly includes a package 110, a lid 120, and the piezoelectric vibrating piece 140 that vibrates at a predetermined vibration frequency (see FIG. 2B and FIG. 3A). The piezoelectric device 100 has an outside mainly formed of the package 110 and the lid 120, and has an outer shape formed in, for example, an approximately rectangular parallelepiped shape. The piezoelectric device 100 internally includes the piezoelectric vibrating piece 140. The piezoelectric device 100 illustrated in FIG. 2A is formed so as to have a longitudinal direction in an X'-axis direction, a height direction of the piezoelectric device 100 in a Y"-axis direction, and a direction perpendicular to the X'-axis direction and the Y"-axis direction in a Z'-axis direction.

The package 110 has a mounting surface 112a on a −Y"-axis side as a surface on which the piezoelectric device 100 is mounted, and mounting terminals 111 are formed on the mounting surface 112a. The mounting terminals 111 include hot terminals 111a as terminals connected to the piezoelectric vibrating piece 140 and terminals usable for grounding (hereinafter temporarily referred to as grounding terminals) 111b. On the package 110, the hot terminal 111a is disposed on each of a corner on a −Z'-axis side of a +X'-axis side and a corner on a +Z'-axis side of a −X'-axis side of the mounting surface 112a, and the grounding terminal 111b is disposed on each of a corner on the +Z'-axis side of the +X'-axis side and a corner on the −Z'-axis side of the −X-axis side of the mounting surface 112a. On a surface of a +Y"-axis side of the package 110, a cavity 113 is formed (see FIG. 2B) as a space where the piezoelectric vibrating piece 140 is placed, and the cavity 113 is sealed by the lid 120 via a sealing material 130.

FIG. 2B is a perspective view of the piezoelectric device 100 where the lid 120 is removed. The cavity 113, formed on the surface of the +Y"-axis side of the package 110, is surrounded by a placement surface 112b and a sidewall 114. The placement surface 112b is a surface on an opposite side of the mounting surface 112a, and the piezoelectric vibrating piece 140 is placed on the placement surface 112b. The sidewall 114 is formed on a peripheral area of the placement surface 112b. On the placement surface 112b, a pair of connection electrodes 115 is formed and electrically connected to the hot terminals 111a. The piezoelectric vibrating piece 140 is placed on the placement surface 112b such that extraction electrodes 143 are electrically connected to the connection electrodes 115 via conductive adhesives 131.

Figure 3A:
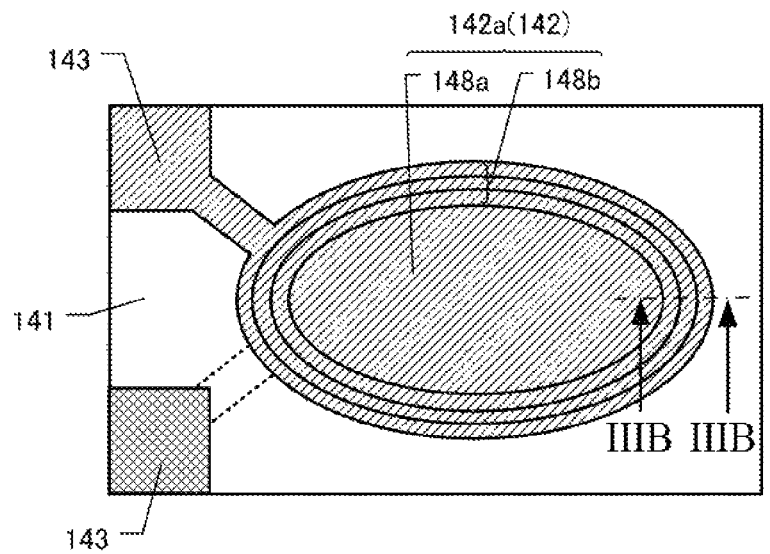
FIG. 3A is a plan view of the piezoelectric vibrating piece 140.

FIG. 3A is a plan view of the piezoelectric vibrating piece 140. The piezoelectric vibrating piece 140 includes the piezoelectric substrate 141, excitation electrodes 142, and the extraction electrodes 143. The piezoelectric substrate 141 is formed in a flat plate shape and made of the M-SC cut quartz-crystal material that vibrates in a thickness-shear vibration. The excitation electrodes 142 are formed on both principal surfaces on the +Y"-axis side and the −Y"-axis side of the piezoelectric substrate 141. The extraction electrodes 143 are extracted from the excitation electrodes 142 to both ends of a side on the −X'-axis side of the piezoelectric substrate 141. The piezoelectric substrate 141 is a flat plate-shaped substrate that has a rectangular flat surface having long sides extending in the X'-axis direction and short sides extending in the Z'-axis direction. The excitation electrode 142 is formed in an elliptical shape having a long axis extending in the X'-axis direction and a short axis extending in the Z'-axis direction. And, the excitation electrode 142 includes a first excitation electrode 142a formed on a surface on the +Y"-axis side of the piezoelectric substrate 141 and a second excitation electrode 142b (see FIG. 3B) formed on the −Y"-axis side of the piezoelectric substrate 141. The first excitation electrode 142a and the second excitation electrode 142b are formed in an identical flat surface shape and identical size, and formed so as to mutually overlap as a whole in the Y"-axis direction. The first excitation electrode 142a and the second excitation electrode 142b may be formed facing in a displaced manner with a predetermined relationship so as not to overlap partially. The first excitation electrode 142a and the second excitation electrode 142b include main thickness portions 148a and inclined portions 148b. The main thickness portion 148a is formed to have a constant thickness. The inclined portion 148b is formed to have a constant width on a peripheral area of the main thickness portion 148a, and formed to have a thickness gradually decreased from a part contacting the main thickness portion 148a toward an outermost periphery of the first excitation electrode 142a or the second excitation electrode 142b.

Figure 3B:
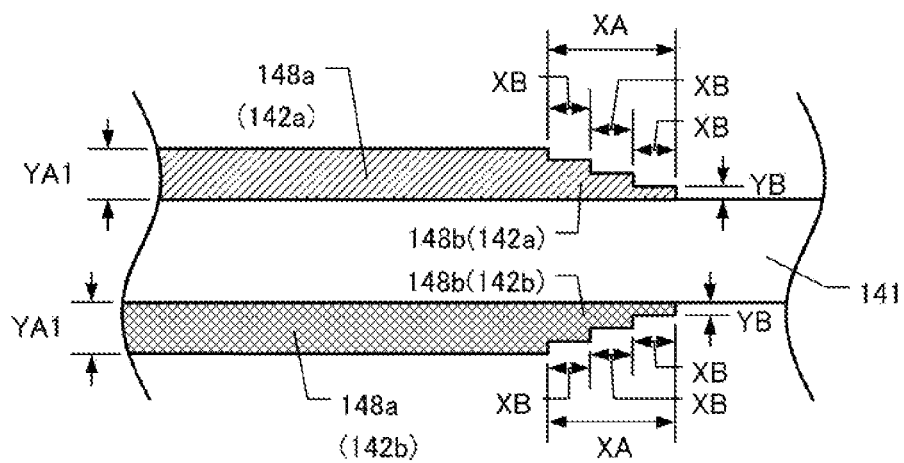
FIG. 3B is a sectional drawing taken along the line IIIB-IIIB in FIG. 3A.

FIG. 3B is a sectional drawing taken along the line IIIB-IIIB in FIG. 3A. The first excitation electrode 142a and the second excitation electrode 142b are formed to have an identical thickness YA1 as a whole. That is, the main thickness portion 148a is formed to have the constant thickness YA1. Here, the first excitation electrode 142a, the second excitation electrode 142b, and the main thickness portion 148a have substantially constant thicknesses, and inevitable variations due to a variation in manufacturing and similar variation are included in "constant." The inclined portions 148b of the first excitation electrode 142a and the second excitation electrode 142b are each formed to have four thickness differences such that the thickness gradually decreases from the main thickness portion 148a side toward the outermost periphery of the first excitation electrode 142a or the second excitation electrode 142b. The inclined portion 148b is formed to have a width XA from the main thickness portion 148a side to the outermost periphery of the first excitation electrode 142a or the second excitation electrode 142b, and a width XB between the respective thickness differences. That is, as illustrated in FIG. 3B, the width XA is configured to be three times of the width XB in length. The respective thickness differences of the inclined portion 148b are configured to have heights YB. Therefore, the thickness YA1 is four times of the height YB in thickness.

<Vibration Energy Loss of Piezoelectric Vibrating Piece>

Figure 4:
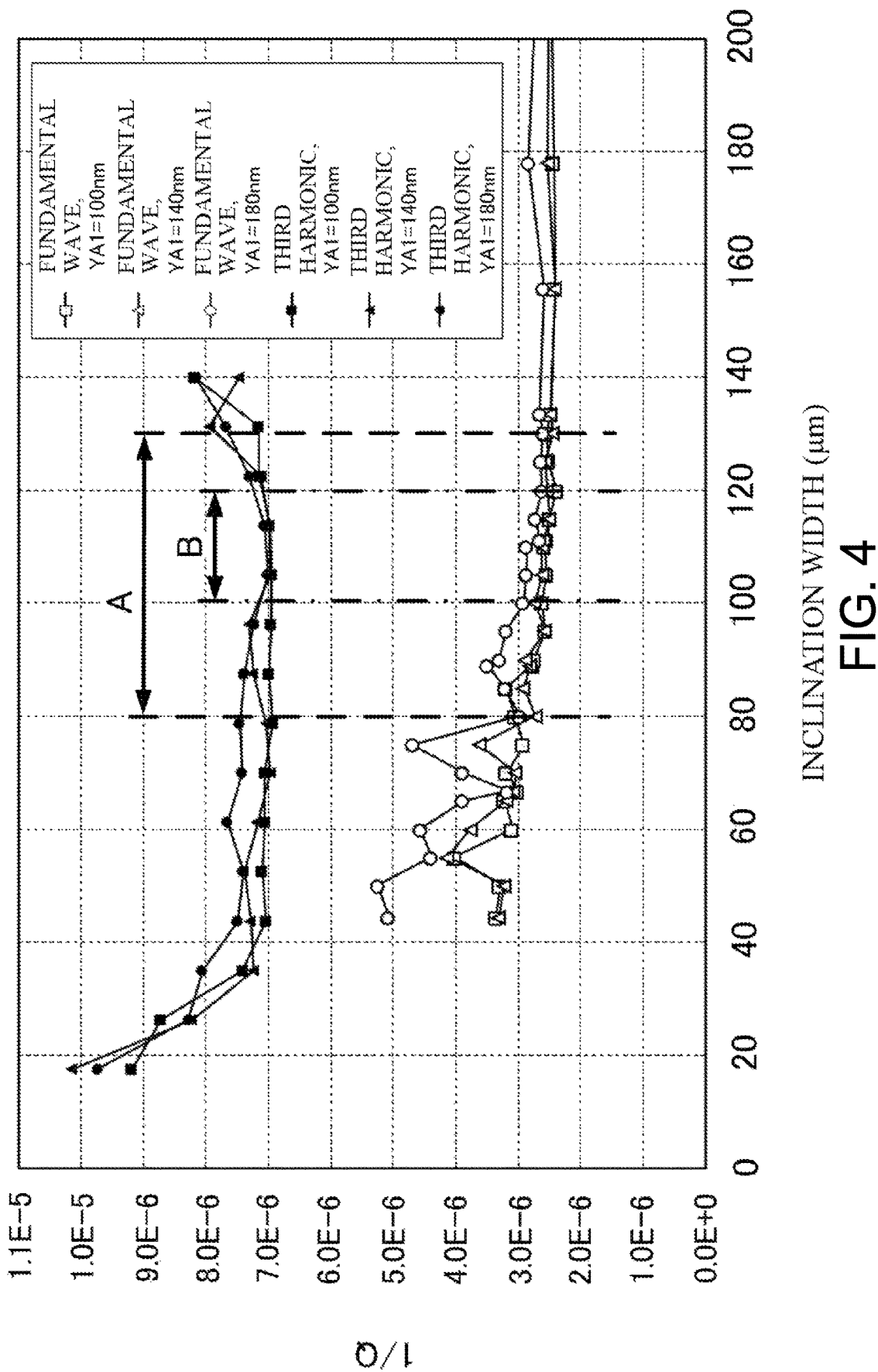
FIG. 4 is a graph indicating a relation between an inclination width of the piezoelectric vibrating piece 140 and a vibration energy loss (1/Q).

FIG. 4 is a graph indicating a relation between an inclination width of the piezoelectric vibrating piece 140 and a vibration energy loss (1/Q). FIG. 4 indicates calculation results on a fundamental wave (frequency: 30 MHz) and a third harmonic (frequency: 90 MHz) in the case where every excitation electrode is constituted of gold (Au) and the main vibration is the C mode with simulations in the cases where the film thicknesses YA1 of the main thickness portion 148a are 100 nm, 140 nm, and 180 nm. The piezoelectric device 100 is used by, for example, being connected to two oscillator circuits to simultaneously oscillate different frequencies. With reference to FIG. 4, a description will be given of the vibration energy loss (1/Q) in the case where such different frequencies are oscillated.

The graph in FIG. 4 has a horizontal axis indicating an inclination width XA (μm). The graph in FIG. 4 has a vertical axis indicating an inverse of a Q factor that indicates the vibration energy loss of the main vibration. In FIG. 4, outlined squares indicate the piezoelectric vibrating piece 140 in the case where the thickness YA1 of the main thickness portion 148a is 100 nm and the fundamental wave is oscillated, outlined triangles indicate the piezoelectric vibrating piece 140 in the case where the thickness YA1 of the main thickness portion 148a is 140 nm and the fundamental wave is oscillated, outlined circles indicate the piezoelectric vibrating piece 140 in the case where the thickness YA1 of the main thickness portion 148a is 180 nm and the fundamental wave is oscillated, black squares indicate the piezoelectric vibrating piece 140 in the case where the thickness YA1 of the main thickness portion 148a is 100 nm and the third harmonic is oscillated, black triangles indicate the piezoelectric vibrating piece 140 in the case where the thickness YA1 of the main thickness portion 148a is 140 nm and the third harmonic is oscillated, and black circles indicate the piezoelectric vibrating piece 140 in the case where the thickness YA1 of the main thickness portion 148a is 180 nm and the third harmonic is oscillated.

In FIG. 4, the relations between the inclination width and the vibration energy loss (1/Q) on the fundamental waves indicate a similar trend regardless of a magnitude of the thickness YA1 of the main thickness portion 148a, and the 1/Q indicating the vibration energy loss is low as $4.0 \times 10^{-6}$ or less in a range of the inclination width XA of approximately 80 μm or more. In the relations between the inclination width and the vibration energy loss (1/Q) on the third harmonics, the 1/Q indicating the vibration energy loss is low as $8.0 \times 10^{-6}$ (in FIG. 4 and the following graphs, "$\times 10^{-6}$" is indicated as "E-6") or less in a range of the inclination width XA from approximately 30 μm to approximately 130 μm. According to the results, in a range (a range A in FIG. 4) of the inclination width XA from approximately 80 μm to approximately 130 μm, where the vibration energy losses (1/Qs) of both the fundamental wave and the third harmonic are low, the vibration energy losses of the piezoelectric vibrating piece 140 are reduced on both the fundamental wave and the third harmonic, thus reducing the vibration energy loss of the piezoelectric vibrating piece 140 in the case of simultaneous oscillation of the fundamental wave and the third harmonic.

Additionally, on the fundamental wave in FIG. 4, a range of the inclination width XA approximately 100 μm or more is particularly preferable because the 1/Q indicating the vibration energy loss is low as $3.0 \times 10^{-6}$ or less. On the third harmonic, a range of the inclination width XA from approximately 40 μm to approximately 120 μm is particularly preferable because the 1/Q indicating the vibration energy loss is stable in a state of low. According to the results, in a range (a range B in FIG. 4) of the inclination width XA from approximately 100 μm to approximately 120 μm, where the vibration energy losses (1/Qs) of both the fundamental wave and the third harmonic are low, the vibration energy losses of the piezoelectric vibrating piece 140 on the fundamental wave and the third harmonic are especially reduced, thus especially reducing the vibration energy loss of the piezoelectric vibrating piece 140 in the case of simultaneous oscillation of the fundamental wave and the third harmonic.

FIG. 4 indicates the example of the M-SC cut. Since the M-SC cut, an SC-cut, an IT-cut, and an AT-cut have what is called a direction angle near 34 to 35 degrees around the X-axis as the crystallographic axis of the crystal, the relation between the inclination width and the loss described in the embodiment shows similar trend. Therefore, the disclosure is applicable to the other crystal resonators that are formed in the SC-cut, the IT-cut, the AT-cut and similar cut and vibrate in the thickness-shear vibration. The disclosure is considered to be applicable to, for example, a piezoelectric ceramic containing LT (lithium tantalite) and similar material. The influence in the case where the piezoelectric substrate other than the M-SC cut is used will be described again in a third embodiment described below.

In the piezoelectric vibrating piece, an unnecessary vibration that is a vibration different from the main vibration and not intended on the design occurs with the main vibration (for example, the C mode). In the piezoelectric vibrating piece that includes the piezoelectric substrate, made of the quartz-crystal material of the AT-cut, the SC-cut, and similar cut and vibrates in the thickness-shear vibration, the influence of especially a flexure vibration as the unnecessary vibration is significant. In the flexure vibration, since the vibration energy is converted into the flexure vibration at mainly an end portion of the excitation electrode and the flexure vibration is superimposed on the main vibration so as to vibrate the entire piezoelectric vibrating piece, the vibration energy is absorbed into a conductive adhesive holding the piezoelectric vibrating piece. Such energy loss due to the flexure vibration leads to the vibration energy loss. When the inclination width XA is normalized with a flexural wavelength as a wavelength of such flexure vibration, the inclination width XA is allowed to be indicated as values applicable to the piezoelectric vibrating piece other than the M-SC cut vibrating in the thickness-shear vibration.

In the M-SC cut piezoelectric vibrating piece 140, a fundamental wave flexural wavelength $\lambda_{1st}$ is approximately 95 μm, and a third harmonic flexural wavelength $\lambda_{3rd}$ is approximately 35 μm. The inclination widths XA normalized with the flexural wavelengths provide the range A in FIG. 4 as 0.84 times or more and 1.37 times or less of the flexural wavelength $\lambda_{1st}$, and 2.29 times or more and 3.71 times or less of the flexural wavelength $\lambda_{3rd}$. The range B in FIG. 4 is 1.05 times or more and 1.26 times or less of the flexural wavelength $\lambda_{1st}$, and 2.86 times or more and 3.43 times or less of the flexural wavelength $\lambda_{3rd}$. When the piezoelectric vibrating piece other than the M-SC cut vibrated in the thickness-shear vibration satisfies the conditions, the vibration energy loss in the case of the simultaneous oscillation of the fundamental wave and the third harmonic ensures being reduced.

Second Embodiment

In the piezoelectric vibrating piece that includes the inclined portion on the excitation electrode, the inclined portion sometimes disappears when the excitation electrode is trimmed for a frequency adjustment of the piezoelectric vibrating piece, thus increasing the vibration energy loss. The following describes the piezoelectric vibrating piece and the piezoelectric device where the vibration energy loss in the frequency adjustment is prevented.

<Configuration of Piezoelectric Device 200>

Figure 5A:
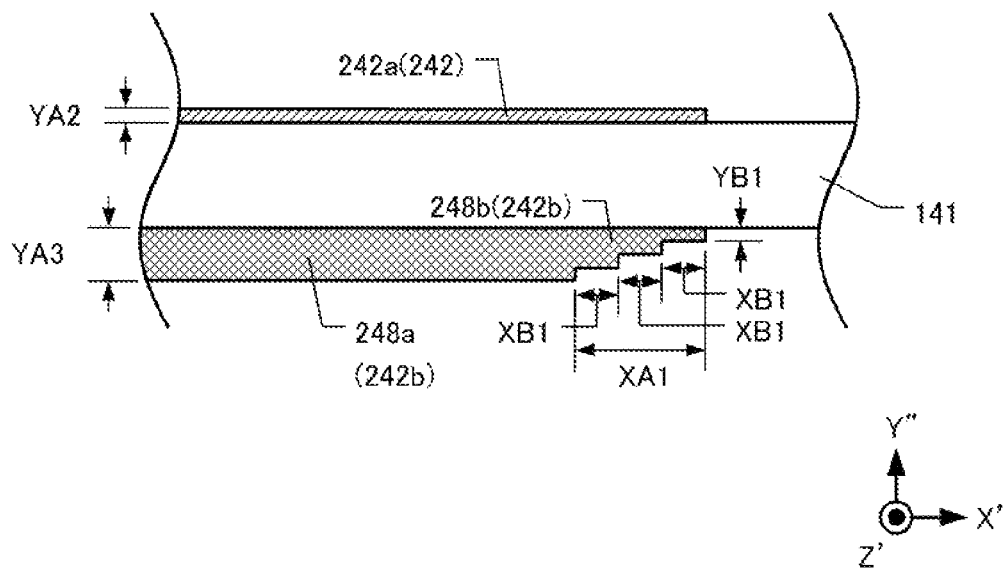
FIG. 5A is a partial sectional drawing of a piezoelectric vibrating piece 240.

FIG. 5A is a partial sectional drawing of a piezoelectric vibrating piece 240. The piezoelectric vibrating piece 240 includes the piezoelectric substrate 141, excitation electrodes 242, and the extraction electrodes 143. The piezoelectric substrate 141 is formed in a flat plate shape and made of the M-SC cut quartz-crystal material that vibrates in the thickness-shear vibration. The excitation electrodes 242 are formed on both principal surfaces on the +Y"-axis side and the −Y"-axis side of the piezoelectric substrate 141. The extraction electrodes 143 are extracted from the excitation electrodes 242 to both ends of a side on the −X'-axis side of the piezoelectric substrate 141. The piezoelectric vibrating piece 240 and the piezoelectric vibrating piece 140 have the configurations in common other than the excitation electrode. The excitation electrode 242 is formed in an elliptical shape having a long axis extending in the X'-axis direction and a short axis extending in the Z'-axis direction as a flat surface shape identical to the excitation electrode 142. And, the excitation electrode 242 includes a first excitation electrode 242a formed on a surface on the +Y"-axis side of the piezoelectric substrate 141 and a second excitation electrode 242b formed on the −Y"-axis side of the piezoelectric substrate 141. The first excitation electrode 242a and the second excitation electrode 242b are formed in an identical flat surface shape and identical size, and formed so as to mutually overlap as a whole in the Y"-axis direction. The first excitation electrode 242a and the second excitation electrode 242b may be formed facing in a displaced manner with a predetermined relationship so as not to overlap partially.

FIG. 5A illustrates a partial sectional drawing of the piezoelectric vibrating piece 240 corresponding to the IIIB-IIIB cross section in FIG. 3A. The first excitation electrode 242a is formed to have an identical thickness YA2 as a whole. The second excitation electrode 242b includes a main thickness portion 248a and an inclined portion 248b. The main thickness portion 248a is formed to have a constant thickness. The inclined portion 248b is formed on a peripheral area of the main thickness portion 248a having a constant width, formed such that the thickness gradually decreases from a part contacting the main thickness portion 248a toward the outermost periphery of the second excitation electrode 242b, and formed to cause the main thickness portion 248a to have a constant thickness YA3. Here, the first excitation electrode 242a and the main thickness portion 248a have substantially constant thicknesses, and inevitable variations due to a variation in manufacturing and similar variation are included in "constant." The thickness YA3 is configured to be thicker than the thickness YA2. The inclined portion 248b of the second excitation electrode 242b is formed to have four thickness differences such that the thickness gradually decreases from the main thickness portion 248a side toward the outermost periphery of the second excitation electrode 242b. The inclined portion 248b is formed to have a width XA1 from the main thickness portion 248a side to the outermost periphery of the second excitation electrode 242b, and a width XB1 between the respective thickness differences. That is, as illustrated in FIG. 5A, the width XA1 is configured to be three times of the width XB1 in length. The respective thickness differences of the inclined portion 248b are configured to have heights YB1. Therefore, the thickness YA3 is four times of the height YB1 in thickness.

Figure 5B:
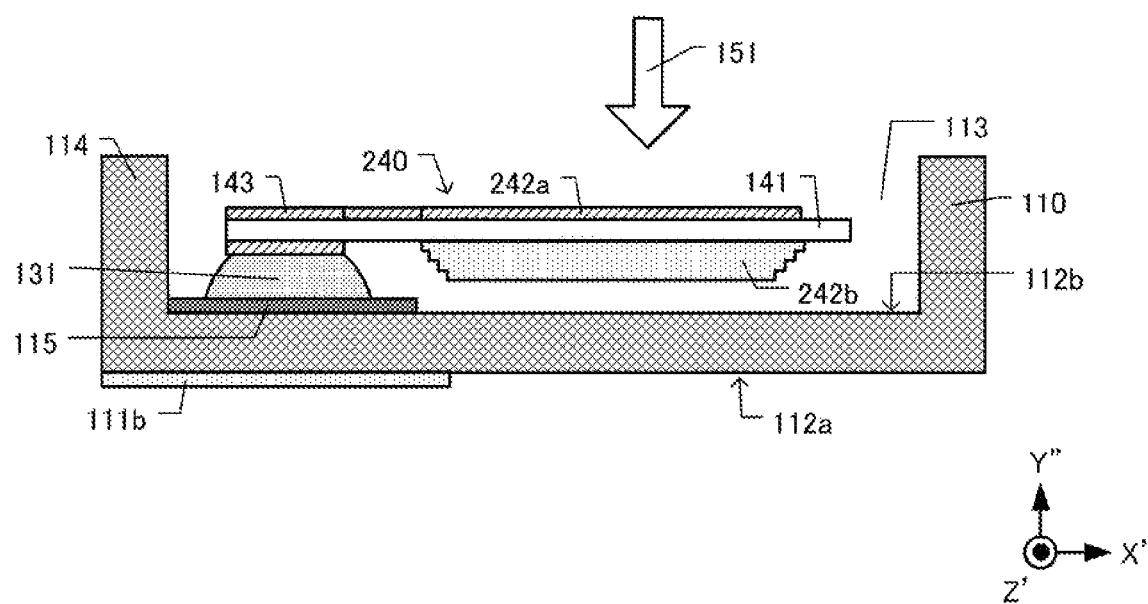
FIG. 5B is a schematic sectional drawing of a piezoelectric device 200 where a lid 120 is removed.

FIG. 5B is a schematic sectional drawing of a piezoelectric device 200 where a lid 120 is removed. The piezoelectric device 200 mainly includes a package 110, the lid 120, and the piezoelectric vibrating piece 240. In the piezoelectric device 200, as illustrated in FIG. 5B, the second excitation electrode 242b is arranged facing the package 110. In the piezoelectric device 200, the frequency is adjusted after the piezoelectric vibrating piece 240 is placed on the package 110. The frequency is adjusted such that, for example, an ion beam 151 constituted of argon (Ar) gas and similar gas is irradiated on the first excitation electrode 242a to trim a part of the first excitation electrode 242a. In the piezoelectric device 200, since the first excitation electrode 242a without the inclined portion is trimmed, the inclined portion does not disappear in the trimming, thus preventing the increase of the vibration energy loss due to the disappearance of the inclined portion.

<Vibration Energy Loss of Piezoelectric Vibrating Piece 240>

The following describes a relation between the thickness of the excitation electrode 242 of the piezoelectric vibrating piece 240 and the vibration energy loss (1/Q) comparing with a piezoelectric vibrating piece 340 (not illustrated) where excitation electrodes having the inclined portions are formed on both principal surfaces of the piezoelectric substrate 141 and a piezoelectric vibrating piece 440 (not illustrated) where excitation electrodes without the inclined portions are formed on both principal surfaces of the piezoelectric substrate 141. The piezoelectric vibrating piece 340 and the piezoelectric vibrating piece 440 have the configurations similar to the piezoelectric vibrating piece 240 except having or not having the inclined portions on both principal surfaces of the piezoelectric vibrating piece.

Figure 6:
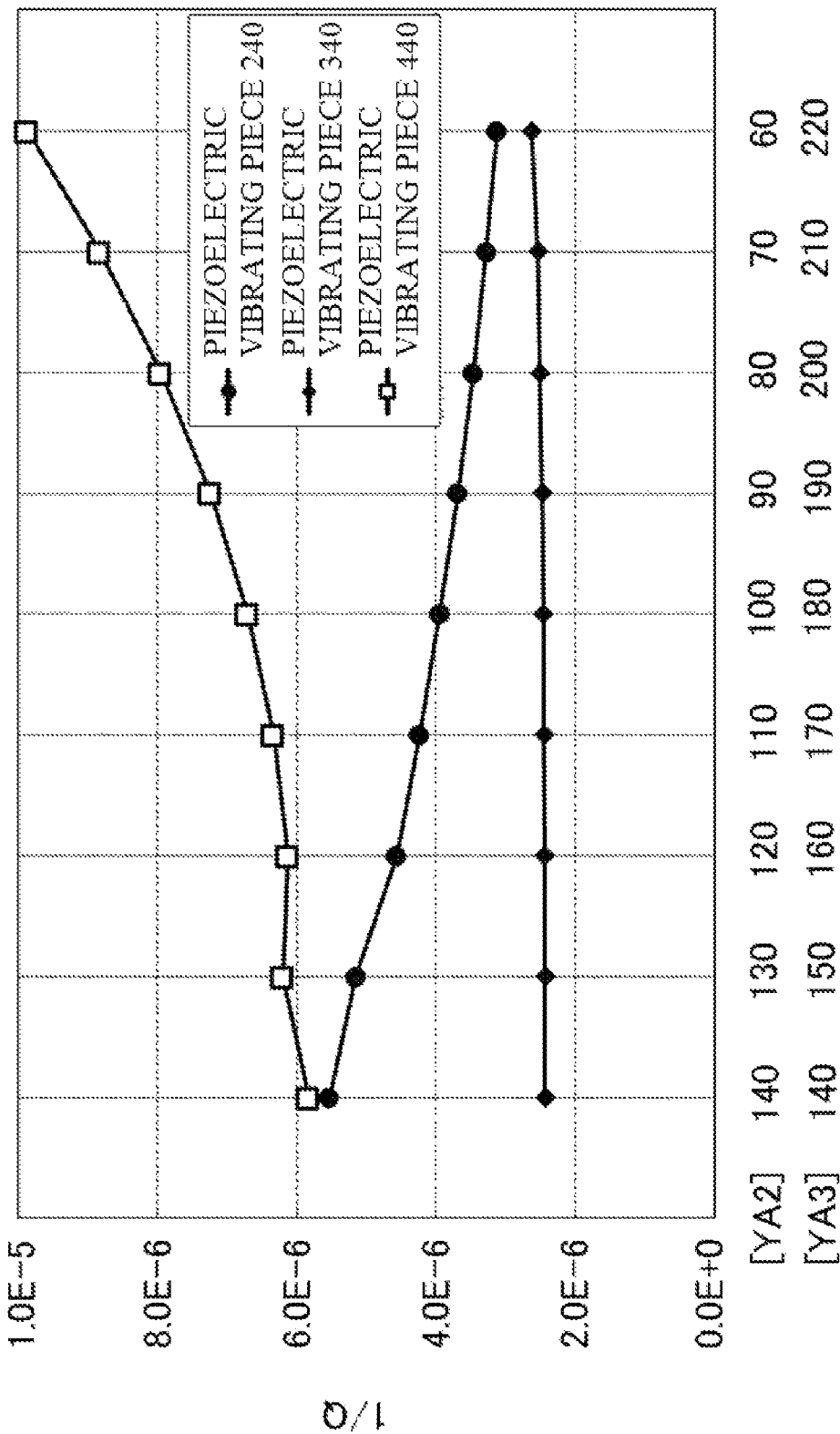
FIG. 6 is a graph indicating relations between thicknesses of excitation electrodes of the piezoelectric vibrating piece 240, a piezoelectric vibrating piece 340, and a piezoelectric vibrating piece 440 and a vibration energy loss (1/Q) of a main vibration.

FIG. 6 is a graph indicating relations between the thicknesses of the excitation electrodes of the piezoelectric vibrating piece 240, the piezoelectric vibrating piece 340, and the piezoelectric vibrating piece 440 and the vibration energy loss (1/Q) of a main vibration. More specifically, the graph indicates a gist of the embodiment where the inclined portion is disposed on the end portion of the excitation electrode on one principal surface of the piezoelectric substrate and the thickness of the excitation electrode on the other principal surface is configured to be thin compared with the excitation electrode on the one principal surface. FIG. 6 indicates calculation results with simulations in the cases where every excitation electrode is constituted of gold (Au), the frequency of the fundamental wave of the main vibration is configured to be 30 MHz (the flexural wavelength $\lambda_{1st}$ is approximately 95 μm), and the inclination width XA is configured to be 133 μm (1.4 times of the flexural wavelength $\lambda_{1st}$), as an analytical model. The graph in FIG. 6 has a horizontal axis indicating the thicknesses YA2 and YA3 of the excitation electrodes. The piezoelectric vibrating piece 240, the piezoelectric vibrating piece 340, and the piezoelectric vibrating piece 440 each have the thickness of the excitation electrode 242 such that a sum of the thickness YA2 and the thickness YA3 is constantly 280 nm, and in FIG. 6, the thickness YA3 increases toward the right side of the graph. A vertical axis in FIG. 6 indicates the vibration energy loss (1/Q) of the main vibration (for example, the C mode). In FIG. 6, black circles indicate the piezoelectric vibrating piece 240, black diamonds indicate the piezoelectric vibrating piece 340, and outlined squares indicate the piezoelectric vibrating piece 440. The reason why the simulation is performed under the condition where the sum of the thickness YA2 and the thickness YA3 is constantly 280 nm is to ensure what is called an energy confinement in the piezoelectric vibrating piece. That is, the reason is to confirm the effects of the embodiment on the premise of ensuring the energy confinement. However, the value 280 nm is an example corresponding to the size, the shape, and the frequency of the piezoelectric substrate of the embodiment.

In the piezoelectric vibrating piece 240, when the thickness YA2 and the thickness YA3 are 140 nm, the 1/Q indicating the vibration energy loss is approximately 5.5× $10^{-6}$. In the piezoelectric vibrating piece 240, the thickness YA2 of the first excitation electrode 242a without the inclined portion is decreased, and the thickness YA3 of the second excitation electrode 242b is increased instead, thus decreasing the 1/Q such that the 1/Q is approximately 3.1×$10^{-6}$ when the thickness YA2 is 60 nm and the thickness YA3 is 220 nm. That is, it is seen that, in the piezoelectric vibrating piece 240, the inclined portion disposed on the edge of the excitation electrode on one surface of the piezoelectric substrate and the other excitation electrode having decreased thickness reduce the loss of the piezoelectric vibrating piece. On the other hand, in the piezoelectric vibrating piece 340 as one comparative example having the inclined portions on the excitation electrodes of both surfaces, even in the case where the thickness YA2 and the thickness YA3 are changed (in the piezoelectric vibrating piece 340 and the piezoelectric vibrating piece 440, the thickness of the excitation electrode on the +Y"-axis side of the piezoelectric substrate is YA2, and the thickness of the excitation electrode on the -Y"-axis side is YA3), the 1/Q is stabilized at approximately 2.4×$10^{-6}$ to approximately 2.6× $10^{-6}$, and it is preferable as the property at a glance. However, in the piezoelectric vibrating piece 340, since the inclined portions formed on the excitation electrodes of both surfaces sometimes causes the inclined portion of the excitation electrode on a frequency adjustment surface side to disappear during the frequency adjustment, an actual product sometimes fails to maintain the property. In the piezoelectric vibrating piece 440 as the other one comparative example without the inclined portions on the excitation electrodes of both surfaces, in the case where the thickness YA2 and the thickness YA3 are changed, the 1/Q increases as the thickness YA3 increases, and when the thickness YA3 is 220 nm, the 1/Q is approximately 9.9×$10^{-6}$. That is, in the piezoelectric vibrating piece 440, an unnecessary mode is caused by the thickness differences of the edge portion of the excitation electrode as the thickness YA3 increases, thus increasing the loss.

In the piezoelectric vibrating piece 240 according to the embodiment, when the thickness YA2 and the thickness YA3 are 140 nm, the value of the 1/Q of the piezoelectric vibrating piece 240 approaches the value of the 1/Q of the piezoelectric vibrating piece 440. This is considered because the piezoelectric vibrating piece 240 includes the inclined portion 248b on the second excitation electrode 242b while the first excitation electrode 242a does not include the inclined portion, thus not sufficiently reducing the influence on the main vibration of the flexure vibration. In the piezoelectric vibrating piece 240, the 1/Q decreases as the thickness YA2 of the first excitation electrode 242a decreases, and when the thickness YA2 is 60 nm, the 1/Q of the piezoelectric vibrating piece 240 approaches the 1/Q of the piezoelectric vibrating piece 340. This is considered because the thickness YA2 of the first excitation electrode 242a is decreased to reduce the influence of the thickness differences on the electrode end portion, thus reducing the generation of the flexure vibration on the first excitation electrode 242a. That is, in the piezoelectric vibrating piece 240, the thickness of the first excitation electrode 242a without the inclined portion is preferred to be thin.

The thickness YA2 of the first excitation electrode 242a is preferred to be thin as much as possible on the premise that an induction of the unnecessary mode is reduced at the end portion of the first excitation electrode 242a and an original function of the electrode as a conductive film is obtained. FIG. 6 indicates that, in the piezoelectric vibrating piece 240, the decreased thickness YA2 ensures reducing the influence on the main vibration of the flexure vibration. On the other hand, it has been known that, in a thin-film technique, a lower limit range of a thickness to form a film is from 60 nm to 100 nm. Taking this into account, for the first excitation electrode 242a to provide the original function as the electrode, the thickness YA2 is required to be at least from 60 nm to 100 nm, preferably, from 60 nm to 80 nm. That is, the thickness YA2 of the first excitation electrode is preferred to be in a range of 60 nm to 100 nm, preferably 60 nm to 80 nm.

In the piezoelectric vibrating piece 240, instead of a processing such as a bevel processing or a convex processing performed on the used piezoelectric substrate 141, the excitation electrode is formed to have a predetermined thickness, thus confining the vibration energy. Accordingly, the thickness YA3 of the second excitation electrode 242b is preferred to be chosen such that the sum of the thickness YA2 of the first excitation electrode 242a and the thickness YA3 of the second excitation electrode 242b becomes a film thickness enough to perform the vibration energy confinement. Specifically, the thickness YA3 is allowed to be determined among values where a sum of the thicknesses of both excitation electrodes is approximately several % with respect to a plate thickness of the piezoelectric substrate in consideration of the size, the frequency, and similar factor of the piezoelectric vibrating piece, and is preferred to be chosen from, for example, 2% to 5%. In the piezoelectric vibrating piece 240, the second excitation electrode 242b is configured to be thick in thickness to ensure the film thickness as the sum of the entire excitation electrode 242, and the second excitation electrode 242b is configured to include the inclined portion 248b to prevent the vibration energy from being converted into the flexure vibration at the end portion of the second excitation electrode 242b.

FIG. 6 indicates that the first excitation electrode 242a configured to have the thickness thinner than the thickness of the second excitation electrode 242b ensures decreasing the 1/Q to the value close to the case where the excitation electrodes on both principal surfaces are configured to include the inclined portions (the piezoelectric vibrating piece 340), thus providing the piezoelectric vibrating piece applicable to practical use. Such trend applies to the case where the fundamental wave and the third harmonic are simultaneously oscillated, and applies to the case where the other quartz-crystal material, such as the AT-cut, the SC-cut, and the IT-cut, that vibrates in the thickness-shear vibration is employed, or the case where the other piezoelectric material, such as LT (lithium tantalite) and piezoelectric ceramic, that vibrates in the thickness-shear vibration is employed for the piezoelectric substrate. Furthermore, the trend also applies to the case where the excitation electrode is formed in a circular shape.

Third Embodiment

The following describes an influence depending on the difference of the outer shape of the excitation electrode, an influence in the case where the piezoelectric substrate that vibrates in the thickness-shear vibration other than the M-SC cut is employed, and a relation between the thickness of the excitation electrode and an optimum range of the inclination width.

Figure 7A:
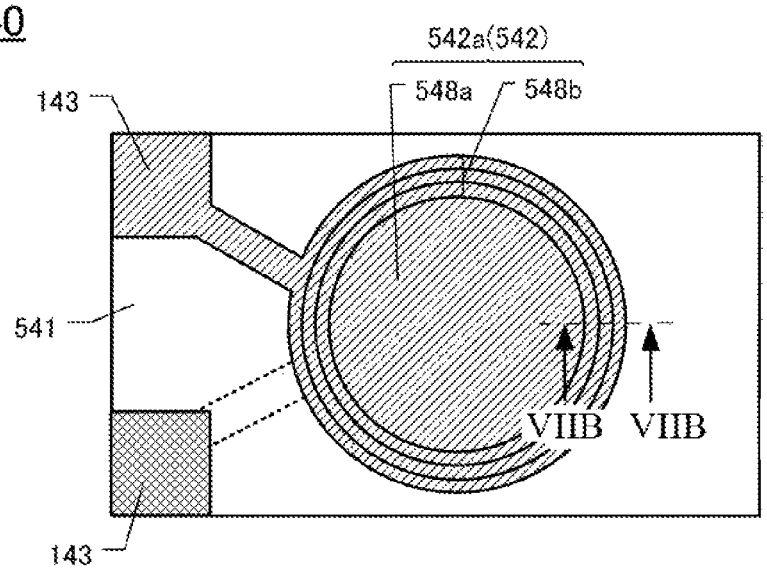
FIG. 7A is a plan view of a piezoelectric vibrating piece 540.
Figure 7A:
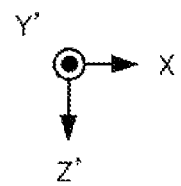

FIG. 7A is a plan view of a piezoelectric vibrating piece 540. The piezoelectric vibrating piece 540 includes a piezoelectric substrate 541 on which an excitation electrode 542 and extraction electrodes 143 are disposed. The piezoelectric substrate 541 is made of an AT-cut quartz-crystal material that vibrates in the thickness-shear vibration as a base material different from the piezoelectric substrate 141. The AT-cut quartz-crystal material is formed by inclining a principal surface (XZ-surface) around an X-axis from a Z-axis in a −Y-axis direction by 35 degrees 15 minutes with respect to a Y-axis of a crystallographic axes (XYZ), and FIG. 7A indicates the inclined new axes of the AT-cut quartz-crystal material as a Y'-axis and a Z'-axis. The excitation electrode 542 has a flat surface shape in a circular shape, and the extraction electrodes 143 are extracted from the excitation electrode 542 on both ends of a side on a −X-axis side of the piezoelectric substrate 541. The excitation electrode 542 includes a main thickness portion 548a and an inclined portion 548b. The main thickness portion 548a has a thickness indicated as YA4.

Figure 7B:
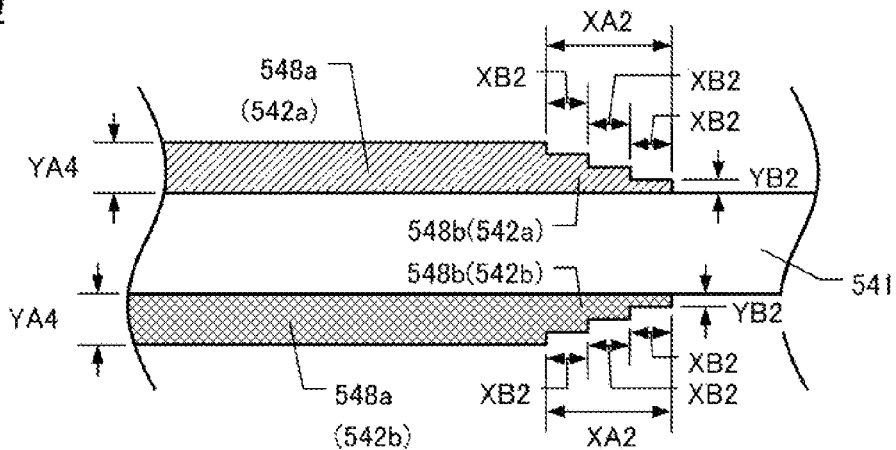
FIG. 7B is a sectional drawing taken along the line VIIB-VIIB in FIG. 7A.
Figure 7B:
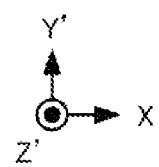

FIG. 7B is a sectional drawing taken along the line VIIB-VIIB in FIG. 7A. The excitation electrode 542 includes a first excitation electrode 542a formed on a surface on a +Y'-axis side of the piezoelectric substrate 541 and a second excitation electrode 542b formed on a surface on a −Y'-axis side. Both the first excitation electrode 542a and the second excitation electrode 542b include the main thickness portion 548a and the inclined portion 548b. The main thickness portion 548a has the thickness YA4. The inclined portion 548b is formed to have a width XA2 from the main thickness portion 548a side to the outermost periphery of the excitation electrode 542, formed to have a thickness gradually decreased from the main thickness portion 548a side toward the outermost periphery of the excitation electrode 542, and formed of four thickness differences configured to each have a width XB2 and a height YB2.

Figure 8A:
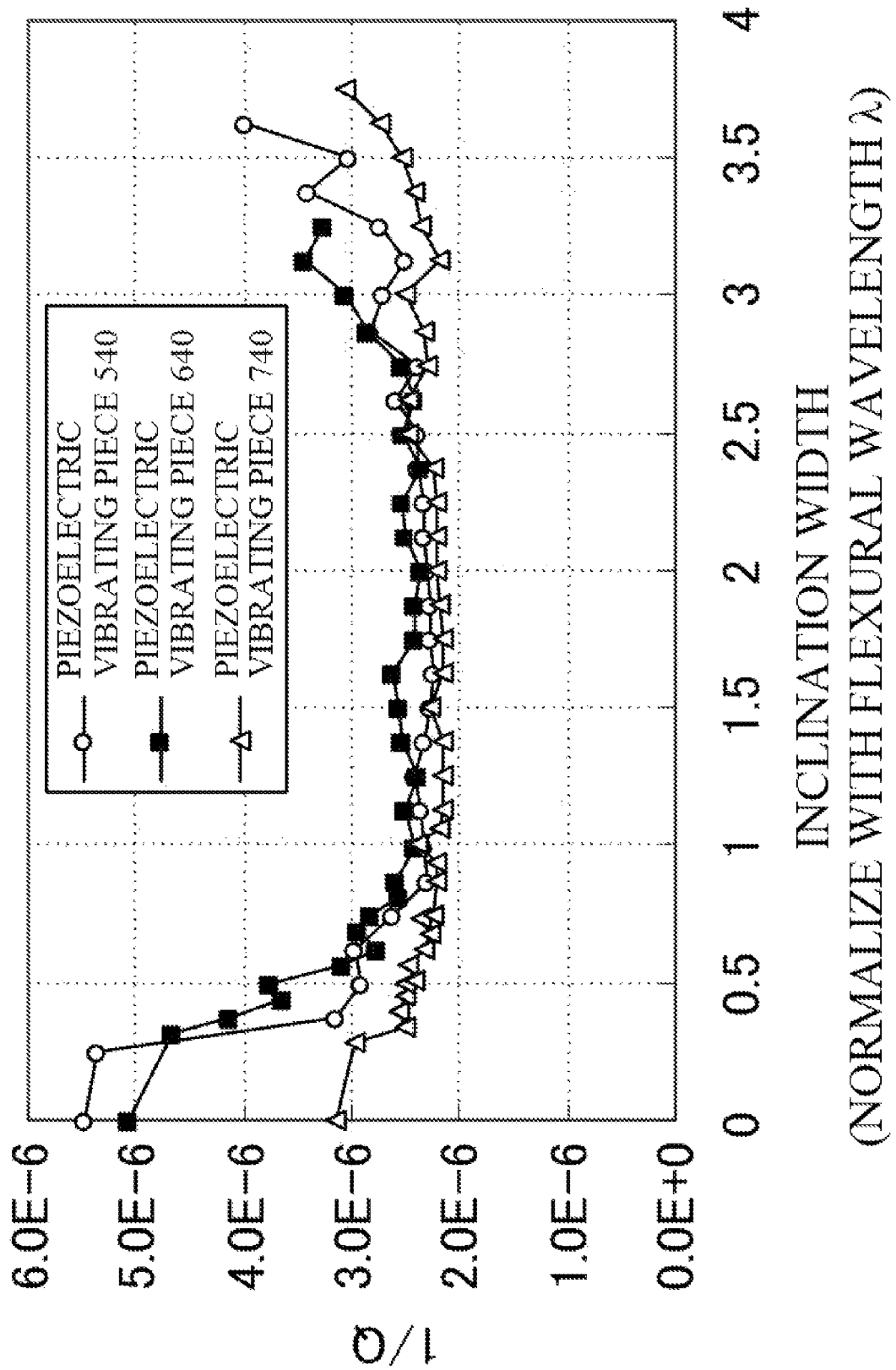
FIG. 8A is a graph indicating relations between inclination widths XA2 of the piezoelectric vibrating piece 540, a piezoelectric vibrating piece 640, and a piezoelectric vibrating piece 740 and the vibration energy loss (1/Q) of the main vibration.

FIG. 8A is a graph indicating relations between inclination widths XA2 of the piezoelectric vibrating piece 540, a piezoelectric vibrating piece 640, and a piezoelectric vibrating piece 740 and the vibration energy loss (1/Q) of the main vibration. The piezoelectric vibrating piece 640 is a piezoelectric vibrating piece where an excitation electrode 442 of the piezoelectric vibrating piece 540 has a flat surface shape in an elliptical shape. The piezoelectric vibrating piece 740 is a piezoelectric vibrating piece where the M-SC cut piezoelectric substrate 141 (see FIG. 3A) is employed instead of the piezoelectric substrate 541 of the piezoelectric vibrating piece 540. The other components of the piezoelectric vibrating piece 640 and the piezoelectric vibrating piece 740 are similar to the piezoelectric vibrating piece 540. FIG. 8A indicates calculation results with simulations in the case where the frequency of the main vibration is 26 MHz (a flexural wavelength λ is approximately 100 μm in the AT-cut quartz-crystal material, and the flexural wavelength λ is approximately 110 μm in the M-SC cut quartz-crystal material) and the thickness YA4 of the main thickness portion 548a of the excitation electrode 542 is 140 nm. In FIG. 8A, outlined circles indicate the piezoelectric vibrating piece 540, black squares indicate the piezoelectric vibrating piece 640, and outlined triangles indicate the piezoelectric vibrating piece 740. The graph in FIG. 8A has a horizontal axis indicating the inclination width normalized with the flexural wavelength λ as the wavelength of the flexure vibration. Therefore, on the inclination width indicated in the graph in FIG. 8A, actual dimensions of the inclination widths are different depending on the piezoelectric vibrating pieces even on the identical scale. For example, in the case where the main vibration is the vibration with the vibration frequency of 26 MHz, the flexural wavelength λ is approximately 100 μm in the piezoelectric vibrating piece 140 that includes the piezoelectric substrate formed of the AT-cut quartz-crystal material, and the flexural wavelength λ, is approximately 110 μm in the piezoelectric vibrating piece 240 that includes the piezoelectric substrate formed of the M-SC cut quartz-crystal material. Here, in the graph in FIG. 8A, the actual dimension of the inclination width indicated by "1" is 1×λ, and the inclination width is 1×λ=approximately 100 μm in the piezoelectric vibrating piece 140 and the inclination width is 1×λ=approximately 110 μm in the piezoelectric vibrating piece 240.

In FIG. 8A, on each of the piezoelectric vibrating piece 540, the piezoelectric vibrating piece 640, and the piezoelectric vibrating piece 740, in the case where the inclination width is configured to be in a range of 0.5 to 3, that is, the inclination width is configured to have the length of 0.5 times or more and three times or less of the flexural wavelength λ as the wavelength of the flexure vibration as the unnecessary vibration, the 1/Q is low and preferable. Especially, in the case where the inclination width is configured to have the length of one time or more and 2.5 times or less of the flexural wavelength λ, the 1/Q is low and stable so as to be more preferable. That is, FIG. 8A shows that the inclination width normalized with the flexural wavelength does not significantly depend on the flat surface shape of the excitation electrode and the difference of the material of the piezoelectric substrate that vibrates in the thickness-shear vibration. Therefore, when the results shown by the first embodiment and the second embodiment are indicated by the inclination width normalized with the flexural wavelength, the results applies to the case where the excitation electrode is formed in the circular shape and the case where the piezoelectric substrate that vibrates in the thickness-shear vibration other than the M-SC cut is employed.

Figure 8B:
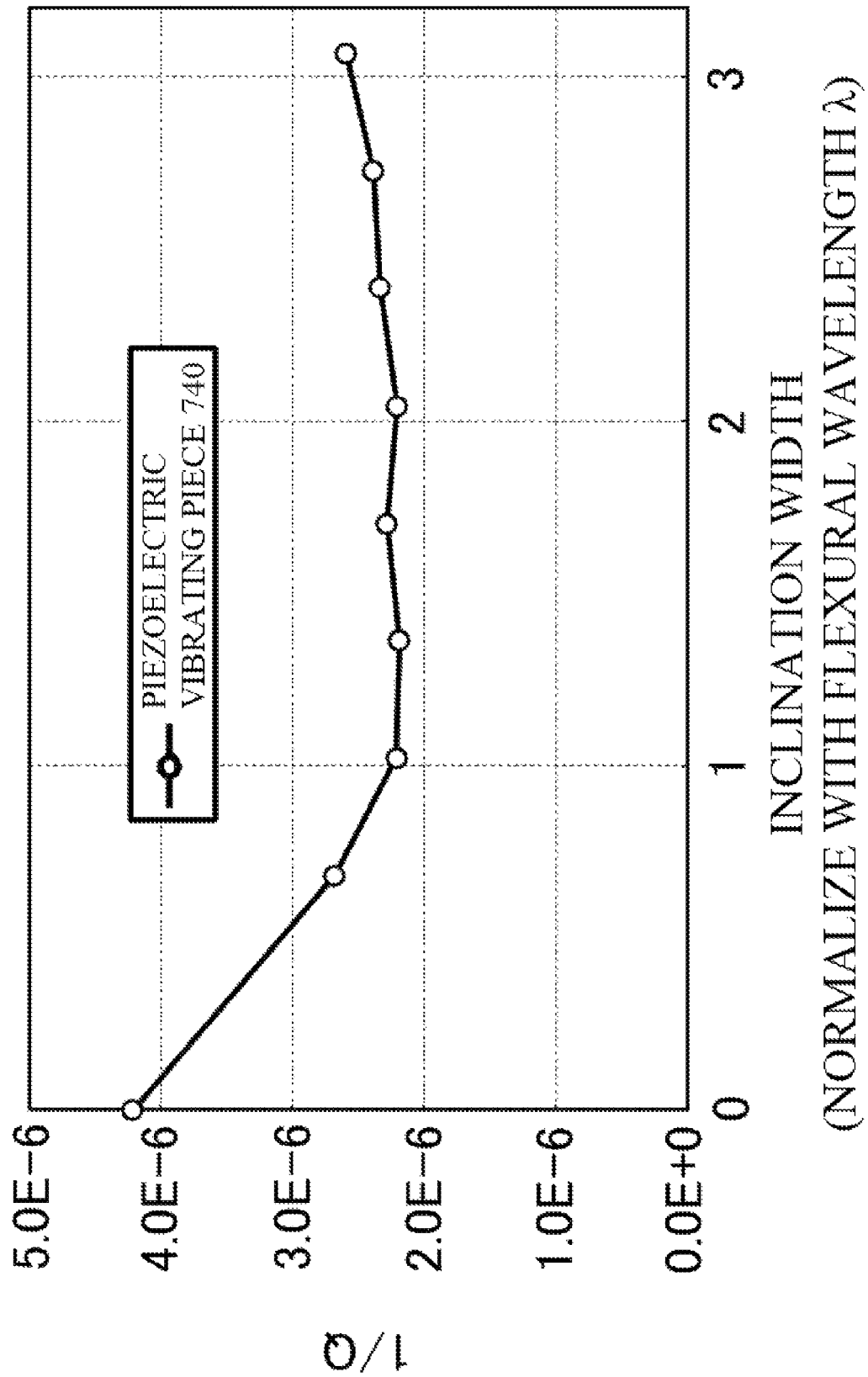
FIG. 8B is a graph indicating a relation between an inclination width of the piezoelectric vibrating piece 740 having 100 nm in a thickness YA4 of a main thickness portion 548a and the vibration energy loss (1/Q) of the main vibration.

FIG. 8B is a graph indicating a relation between an inclination width of the piezoelectric vibrating piece 740 having 100 nm in the thickness YA4 of a main thickness portion 548a and the vibration energy loss (1/Q) of the main vibration. As shown in FIG. 8B, even in the case where the thickness of the excitation electrode (the thickness of the main thickness portion 548a) is changed, the vibration energy loss is reduced when the inclination width is configured to have the length of 0.5 times or more and three times or less of the flexural wavelength λ. Furthermore, it is seen that the vibration energy loss is much reduced when the inclination width is configured to have the length of one time or more and 2.5 times or less of the flexural wavelength λ. Therefore, it is seen that, even in the case where the thickness of the excitation electrode is changed, the inclination width is effective in a range of 0.5 times or more and three times or less, preferably, one time or more and 2.5 times or less of the flexural wavelength λ. This trend is confirmed even in the case where the thickness of the excitation electrode is in a range of at least 70 nm to 200 nm. Thus, FIG. 8A and FIG. 8B show that the appropriate range of the inclination width does not significantly depend on the thickness of the excitation electrode.

The results, derived from FIG. 8A and FIG. 8B, where the inclination width normalized with the flexural wavelength does not significantly depend on the flat surface shape of the excitation electrode and the difference of the material of the piezoelectric substrate that vibrates in the thickness-shear vibration, and where the appropriate range of the inclination width does not significantly depend on the thickness of the excitation electrode apply to the piezoelectric vibrating pieces in the first embodiment and the second embodiment. That is, in the first embodiment and the second embodiment, even in the case where the flat surface shape of the excitation electrode is changed to the other shape such as a circular shape, the piezoelectric substrate that vibrates in the thickness-shear vibration other than the M-SC cut is employed, and the thickness of the excitation electrode is changed, the vibration energy loss in the case of the simultaneous oscillation of the fundamental wave and the third harmonic can be reduced when the conditions derived from the first embodiment and the second embodiment are satisfied.

Fourth Embodiment

While the first embodiment to the third embodiment have shown the simulation results, the actual inclined portion of the excitation electrode can be formed with various methods. The following describes a piezoelectric vibrating piece 140a, a piezoelectric vibrating piece 140b, and a piezoelectric vibrating piece 140c as actual formation examples of the piezoelectric vibrating piece 140 illustrated in FIG. 3A and FIG. 3B.

Figure 9A:
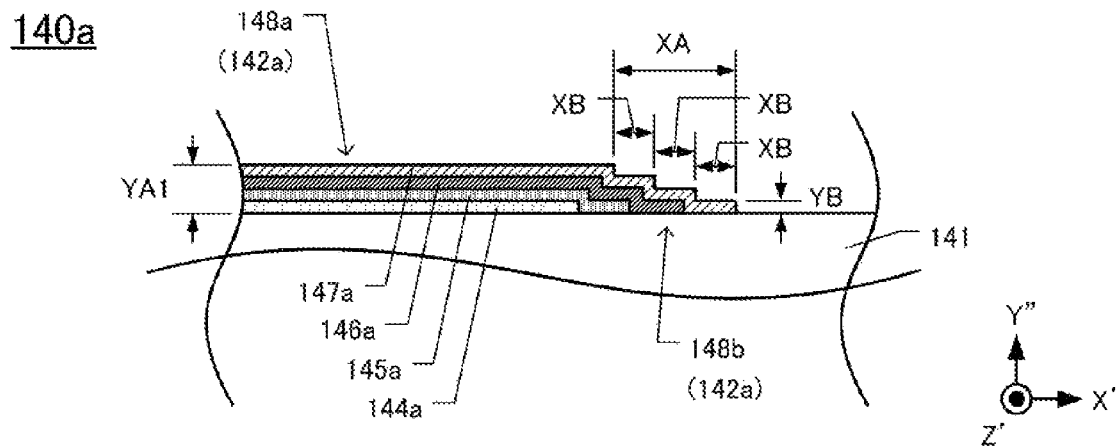

FIG. 9A is a partial sectional drawing of the piezoelectric vibrating piece 140a. FIG. 9A is a partial sectional drawing including a cross section corresponding to the cross section taken along the line IIIB-IIIB in FIG. 3A. The piezoelectric vibrating piece 140a includes an excitation electrode 142 that includes a first layer 144a, a second layer 145a formed to cover the first layer 144a, a third layer 146a formed to cover the second layer 145a, and a fourth layer 147a formed to cover the third layer 146a. The first layer 144a to the fourth layer 147a are formed by, for example, sputtering or evaporation. As illustrated in FIG. 9A, the layers to be laminated are formed to have the sizes gradually increased, thus ensuring the formation of the inclination of the inclined portion 148b. While FIG. 9A illustrates only four layers, illustrations of base layers, such as a chrome film, ordinarily disposed for ensuring adhesion of the piezoelectric substrate 141 with a metal for the excitation electrode are omitted.

Figure 9B:
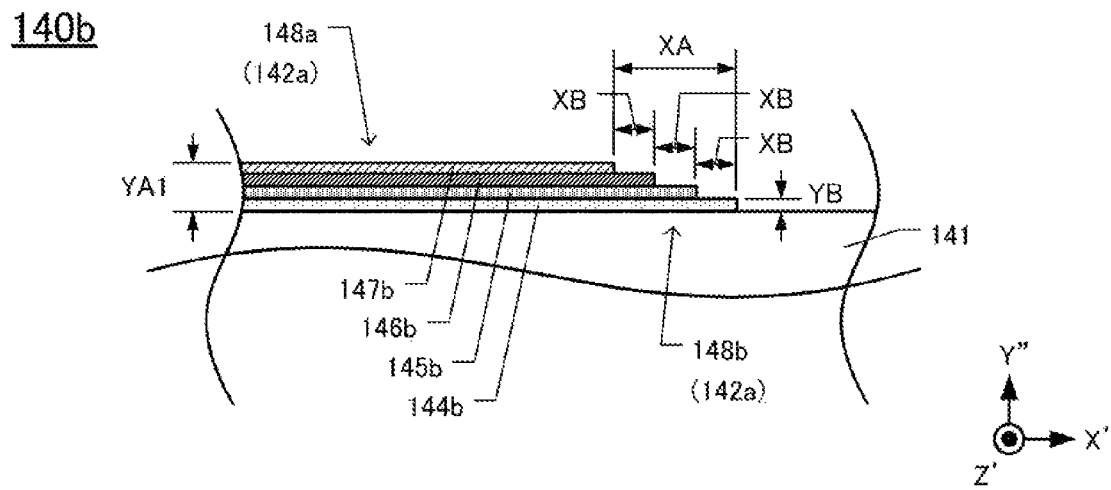
FIG. 9B is a partial sectional drawing of a piezoelectric vibrating piece 140b.

FIG. 9B is a partial sectional drawing of the piezoelectric vibrating piece 140b. FIG. 9B is a partial sectional drawing including a cross section corresponding to the cross section taken along the line IIIB-IIIB in FIG. 3A. The piezoelectric vibrating piece 140b includes an excitation electrode 142 that includes a first layer 144b, a second layer 145b formed to have a small area compared with the first layer 144b on a surface of the first layer 144b, a third layer 146b formed to have a small area compared with the second layer 145b on a surface of the second layer 145b, and a fourth layer 147b formed to have a small area compared with the third layer 146b on a surface of the third layer 146b. The first layer 144b to the fourth layer 147b are formed by, for example, sputtering or evaporation. Contrary to the case of FIG. 9A, as illustrated in FIG. 9B, gradually decreasing the sizes of the layers to be laminated also ensures the formation of the inclination of the inclined portion 148b.

Figure 9C:
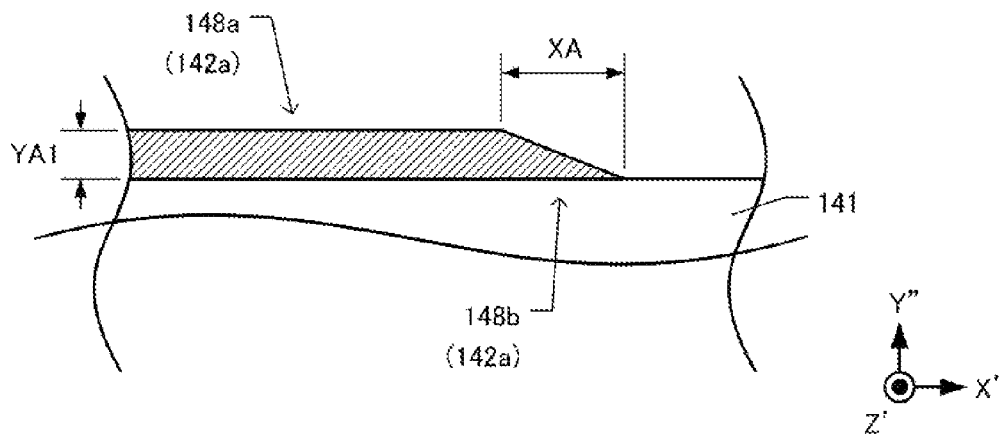
FIG. 9C is a partial sectional drawing of a piezoelectric vibrating piece 140c.

FIG. 9C is a partial sectional drawing of the piezoelectric vibrating piece 140c. FIG. 9C is a partial sectional drawing including a cross section corresponding to the cross section taken along the line IIIB-IIIB in FIG. 3A. The inclination of the inclined portion 148b of the excitation electrode 142 may be formed by an inclined surface illustrated in FIG. 9C instead of the thickness differences. The inclined surface of the inclined portion 148b can be formed by adjusting thickness of resist with a photolithography technology, forming an inclined surface by scraping a part of the excitation electrode with, for example, ion beam trimming after film formation of the excitation electrode, or similar method.

Representative embodiments are described in detail above; however, as will be evident to those skilled in the relevant art, this disclosure may be changed or modified in various ways within its technical scope.

For example, while the inclined portion includes four thickness differences in the above embodiment, the number of the thickness differences is not limited to four, and the number of the thickness differences may be more than four or less than four. The piezoelectric device may be formed as a piezoelectric oscillator where an oscillator circuit is mounted on a package. Furthermore, the above embodiments may be performed in various combinations.

According to the piezoelectric vibrating piece of a third aspect, in the first aspect and the second aspect, the fundamental wave and the third harmonic are simultaneously oscillated to be used.

According to the piezoelectric vibrating piece of a fourth aspect, in the first aspect to the third aspect, the inclination width as the width of the inclined portion is formed in a length of 1.05 times or more and 1.26 times or less of the first flexural wavelength and 2.86 times or more and 3.43 times or less of the second flexural wavelength.

According to the piezoelectric vibrating piece of a fifth aspect, in the first aspect to the fourth aspect, the excitation electrode has an outer shape formed in a circular shape or an elliptical shape.

The piezoelectric device of a sixth aspect includes the piezoelectric vibrating piece in the first aspect to the fifth aspect and a package on which the piezoelectric vibrating piece is placed.

The piezoelectric vibrating piece and the piezoelectric device of the disclosure ensure outputting two signals with different frequencies and reducing the occurrence of the unnecessary vibration.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A piezoelectric vibrating piece, comprising:
   a piezoelectric substrate, formed in a flat plate shape and vibrated in a thickness-shear vibration; and
   excitation electrodes, formed on respective both principal surfaces of the piezoelectric substrate,
   the excitation electrodes each include a main thickness portion and an inclined portion, the main thickness portion is formed to have a constant thickness, the inclined portion is formed on a peripheral area of the main thickness portion, the inclined portion is formed to gradually decrease in thickness from a part contacting the main thickness portion toward an outermost periphery of the excitation electrode, and
   the inclined portion has a width as an inclination width formed in a length of 0.84 times or more and 1.37 times or less of a first flexural wavelength and 2.29 times or more and 3.71 times or less of a second flexural wavelength,
   wherein the first flexural wavelength is a wavelength of a flexure vibration at a fundamental wave of the thickness-shear vibration, the second flexural wavelength is a wavelength of a flexure vibration at a third harmonic of the thickness-shear vibration.

2. The piezoelectric vibrating piece according to claim 1, wherein
   the fundamental wave and the third harmonic are simultaneously oscillated to be used.

3. The piezoelectric vibrating piece according to claim 1, wherein
   the inclination width as the width of the inclined portion is formed in a length of 1.05 times or more and 1.26 times or less of the first flexural wavelength and 2.86 times or more and 3.43 times or less of the second flexural wavelength.

4. The piezoelectric vibrating piece according to claim 1, wherein
   the excitation electrode has an outer shape formed in a circular shape or an elliptical shape.

5. A piezoelectric vibrating piece, comprising:
   a piezoelectric substrate, formed in a flat plate shape and vibrated in a thickness-shear vibration;
   a first excitation electrode, formed on one principal surface of the piezoelectric substrate; and
   a second excitation electrode, formed on another principal surface of the piezoelectric substrate, wherein
   the first excitation electrode is formed to have an identical thickness as a whole,
   the second excitation electrode includes a main thickness portion and an inclined portion, the main thickness portion is formed to have a constant thickness, the inclined portion is formed on a peripheral area of the main thickness portion, the inclined portion is formed to gradually decrease in thickness from a part contacting the main thickness portion toward an outermost periphery of the second excitation electrode,
   the main thickness portion is formed to be thicker than a thickness of the first excitation electrode, and
   the inclined portion has a width as an inclination width formed in a length of 0.84 times or more and 1.37 times or less of a first flexural wavelength and 2.29 times or more and 3.71 times or less of a second flexural wavelength,
   wherein the first flexural wavelength is a wavelength of a flexure vibration at a fundamental wave of the thickness-shear vibration, the second flexural wavelength is a wavelength of a flexure vibration at a third harmonic of the thickness-shear vibration.

6. The piezoelectric vibrating piece according to claim 5, wherein
   the fundamental wave and the third harmonic are simultaneously oscillated to be used.

7. The piezoelectric vibrating piece according to claim 5, wherein
   the inclination width as the width of the inclined portion is formed in a length of 1.05 times or more and 1.26 times or less of the first flexural wavelength and 2.86 times or more and 3.43 times or less of the second flexural wavelength.

8. The piezoelectric vibrating piece according to claim 5, wherein
   the excitation electrode has an outer shape formed in a circular shape or an elliptical shape.

9. A piezoelectric device, comprising:
   the piezoelectric vibrating piece according to claim 1; and
   a package, on which the piezoelectric vibrating piece is placed.

10. A piezoelectric device, comprising:
    the piezoelectric vibrating piece according to claim 5; and
    a package, on which the piezoelectric vibrating piece is placed.

* * * * *